United States Patent [19]

Hiroshi

[11] Patent Number: 4,710,932

[45] Date of Patent: Dec. 1, 1987

[54] METHOD OF AND APPARATUS FOR FAULT DETECTION IN DIGITAL CIRCUITS BY COMPARISON OF TEST SIGNALS APPLIED TO A TEST CIRCUIT AND A FAULTLESS REFERENCE CIRCUIT

[75] Inventor: Kashiwagi Hiroshi, 4-711 Kurokami, Kumamoto-shi, Kumamoto-ken, Japan

[73] Assignee: Kashiwagi Hiroshi, Kumamoto, Japan

[21] Appl. No.: 819,225

[22] Filed: Jan. 15, 1986

[51] Int. Cl.⁴ .............................................. G06F 11/00
[52] U.S. Cl. ......................................... 371/25; 371/27; 324/73 R
[58] Field of Search ................... 324/73 R, 77 R, 112, 324/73 AT; 371/27, 25, 24, 62, 26, 20; 364/200, 900

[56] References Cited

U.S. PATENT DOCUMENTS 4,176,780 12/1979 Sacher .................................... 371/25
4,216,374 8/1980 Lam ........................................ 371/27
4,510,572 4/1985 Recce ..................................... 371/25
4,524,444 6/1985 Efron ..................................... 371/24
4,631,699 12/1986 Siwik ..................................... 371/68

Primary Examiner—Michael R. Fleming
Attorney, Agent, or Firm—Burgess, Ryan & Wayne

[57] ABSTRACT

A fault detection system for electronic circuits is disclosed which comprises a detection circuit in which the crosscorrelation values between the test signal sequence, input to a circuit to be tested, and the output signal sequence from it, with no delay and with delays made in steps to a predetermined time interveral either in the test input signal or in the output sequence, are counted, a reference circuit in which the crosscorrelation values between the test signal sequence input to a faultless reference circuit and the output signal sequence from it, are counted, and a comparator for comparing the crosscorrelation values from both the detection and reference circuit. In one preferred embodiment, one or more of the conventional data compression methods selected from the group of the one's counting, transistion counting, auto-correlation, and C. R. C. methods are incorporated for operation in conjuction with the system.

5 Claims, 5 Drawing Figures

METHOD OF AND APPARATUS FOR FAULT DETECTION IN DIGITAL CIRCUITS BY COMPARISON OF TEST SIGNALS APPLIED TO A TEST CIRCUIT AND A FAULTLESS REFERENCE CIRCUIT

FIELD OF THE INVENTION

The present invention relates in general to a system for fault detection in electronic circuits and in particular to such a system of the type in which a pseudo-random test signal is applied to both a circuit to be tested and a faultless reference circuit to compare the outputs from both circuits in order to check if there is a difference, indicating an abnormality in the various constituent elements of the tested circuit. This invention provides far more enhanced efficiency in fault detection than any prior art fault detection method. It has been proved to greatly reduce residual error rates.

BACKGROUND OF THE INVENTION

A well known method of fault detection in digital circuits is to apply a sequence of test signals of known value to both a circuit to be tested and a reference circuit and to compare the output signals from both circuits.

However, these conventional methods have been found to demand cumbersome efforts on the part of the testers because of the voluminous data arising from two sets of signals output from the two circuits. To eliminate this problem, several improved methods have been developed in which the sequence of output signals is compressed, such as by the one's counting method, transistion counting method, cyclic redundancy check (C. R. C.) method, and auto-correlation method.

A problem in these data compression methods, however, is that since all the output signals from the tested circuits are not individually subject to checking, all possible abnormal states that might be present in the circuit are not always detected.

The undetected error rate for these data compression approaches can be computed as follows;
1. One's counting and auto-correlation methods $$\text{undetected error rate} = \sum_{p=0}^{n} nCp \, (nCp - 1)/\{2^n(2^n - 1)\}$$

2. Transition counting method

Undetected error rate =

$$\sum_{p=0}^{n} 2_n - 1Cp(2_n - 1Cp - 1)/\{2^n(2^n - 1)\}$$

3. C. R. C. method $$\text{Undetected error rate} = H(n - r)(2^{n-r} - 1)/(2^n - 1)$$

where
n: data sequence length
c: binominal constant
r: number of stages in the register (for method 3)
H: step function, providing the value of H(n−r) is either 0, if n>r, or 1, if n≦r (for method 3)

Of the above methods, it is known that the C. R. C. method improves undetected error rates by increasing the number of stages of the shift register. However, this method is not satisfactory in cases where strict fault detection is required.

SUMMARY OF THE INVENTION

The present invention has for its object to provide a fault detection system utilizing the correlation method which can by far markedly improve the undetected error rates.

The basic principle of the present invention can be embodied in two forms of fault detection method and apparatus. In the first version, the correlation values between the test signal sequence input to a circuit to be tested and the output signal sequence from it, with no delay and delays made in steps to a predetermined time interval in the input sequence, are counted and compared with the similarly counted correlation values between the test signal sequence input to and the signal sequence output from a faultless reference circuit, also with no delay and delays made in steps to a predetermined time in the input sequence time interval. In other forms, the correlation values between the sequential test signals input to and the sequential signals output from a circuit to be tested, with no delay and delays made in steps to a predetermined time interval in the output signal sequence are counted and compared with the similarly counted correlation values between the test signal sequence input to and the signal sequence output from a faultless reference circuit, with no delay and delays made in steps to a predetermined time interval in the output signal sequence.

BRIEF EXPLANATION OF THE ACCOMPANYING DRAWINGS

FIG. 1(a) is a fault detection circuit diagram having a delay system adapted for connection on the input side of a circuit to be tested.

A signal generator 2 is provided to supply sequential test signals both to the tested circuit 1 and one or a group of delay circuits 31, 32, - - - , 3m.

Connected to the output of the tested circuit are a related number of correlation counters 40, 41, - - - 4m. Also, the outputs of the delay circuits are connected to a proper one of the counters, respectively. The output of each counter is connected to a comparator 5. A reference circuit of similar construction having a corresponding number of correlation counters counting the correlation values between the sequential output and input signals of a faultless reference circuit 1'. The remaining elements in the reference circuit are indicated by the same reference numerals as the testing circuitry with a prime added thereto.

FIG. 1(b) is a second embodiment of this invention in which the fault detection circuit has a delay system adapted for connection on the output side of a circuit to be tested. A plurality of delay circuits 31, 32, - - - , 3m are connected to the output of the tested circuit. Each output of the delay circuits is connected to a proper one of a related number of correlation counters 40, 41, - - - , 4m.

Also, connected to the input of each counter is the output of the signal generator which supplies sequences of test signals to a circuit to be tested. The output of each counter is connected to a comparator 5. A detection circuit of similar construction having a corresponding number of correlation counters counting the correlation values between the sequential output and input signals of a faultless reference circuit 1' is connected. The remaining elements of the reference circuit are identical to those of the testing circuitry and have the same reference numerals with a prime added thereto.

FIG. 2 shows curves plotted to indicate the undetected error rates of conventional data compression methods and the detection system according to this invention, as computed against the varying number of bits in the output response sequence, taken along the horizontal axis.

FIGS. 3(a) and 3(b) are third and fourth embodiments of this invention in which the embodiments shown in FIGS. 1(a) and 1(b) are respectively combined with a conventional data compression method. In each of the embodiments, a data compression circuit implementing one of the aforesaid methods such as the one's counting, transition counting, auto-correlation, and C. R. C. methods. The data compression circuit 6 is connected at its input to the output of a circuit to be tested and at its output to the input of a comparator 5. Similarly, to the comparator is connected a fault detection circuit for faultless versions of the same circuit also including a similar data compression circuit.

DETAILED DESCRIPTION OF THE PREFERRED EMBODIMENTS

Figure 1A:
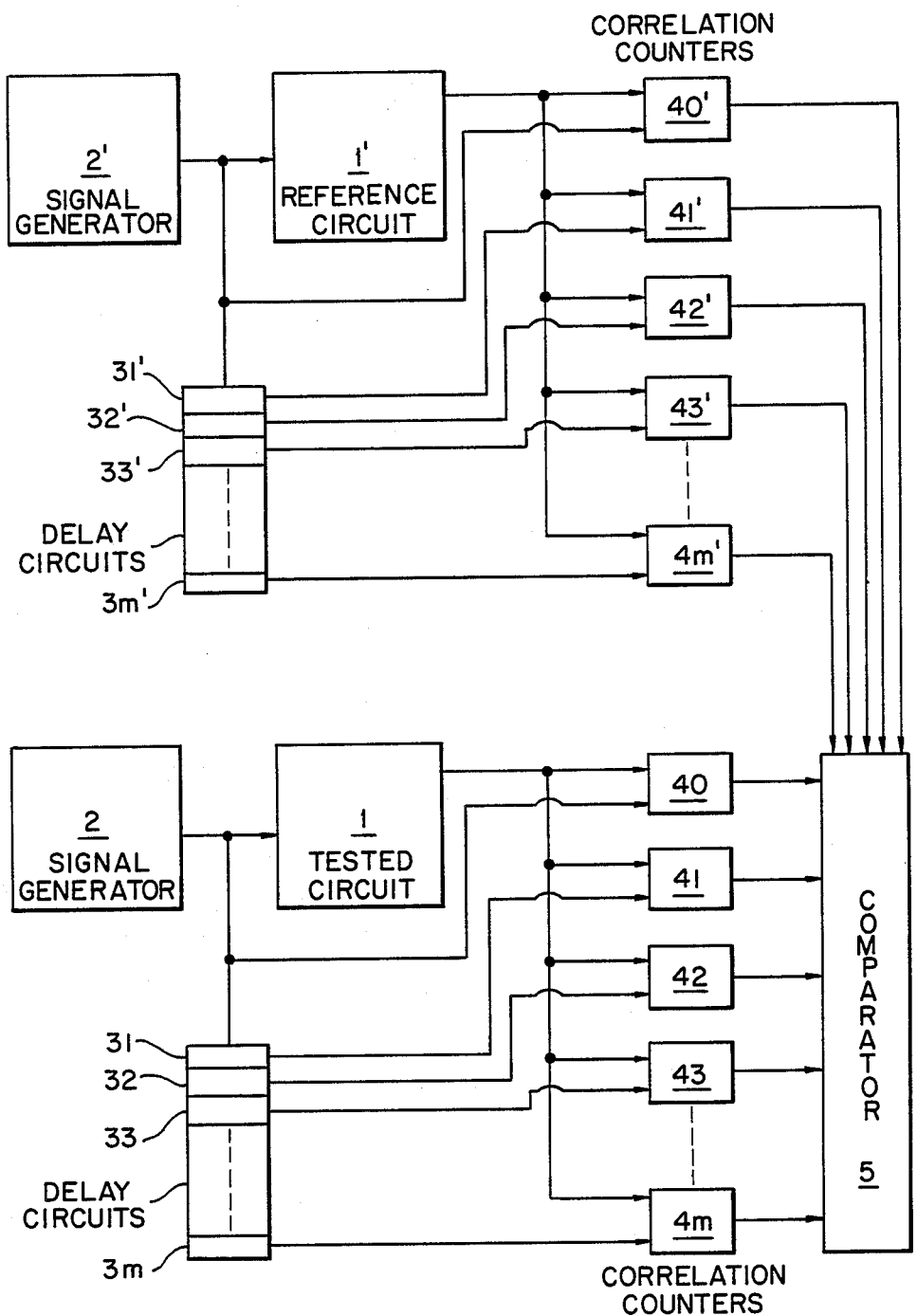

In a fault detection method for digital circuits in which the correlation values of the sequential test signals input to and the sequential signals output from a circuit being tested are counted and compared, how the undetected error rate can be minimized to a greater extent as the input test signal sequence is increased in length and the correlation values are increased in number, will be described in accordance with the present invention.

In this particular embodiment, the test signal is delayed prior to being input to the tested circuit.

However, it is to be understood that it also applies to an embodiment in which the output signal from the tested circuit is delayed, of which description is omitted.

If the sequence of the test signals input to a circuit to be tested is $b_0, b_1, \cdots, b_{n-1}$ and the sequence of signals output from it is $a_0, a_1, \cdots, a_{n-1}$, the correlation value R between them is given as $$R = n - 2 \sum_{i=0}^{n-1} (ai \oplus bi) = n - 2 \sum_{i=0}^{n-1} (\overline{ai}\, bi + ai\, \overline{bi})$$

where $\oplus$ represents an exclusive OR.

1. Fault detection without delaying the input signals:

In this circuit arrangement, the value of R is related in one-to-one correspondence with Q, where $$Q = \sum_{i=0}^{n-1} (ai \oplus bi) = \sum_{i=0}^{n-1} (\overline{ai}\, bi + ai\, \overline{bi}).$$

In this case, $(ai \oplus bi)$ is equal to either 1, if $ai \neq bi$, or 0, if $ai = bi$.

Hence, the probability of the value of Q being a particular value P coincides with the probability that the number of the ai's whose respective value is not equal to their corresponding bi in the input test signal sequence $b_0, b_1, \cdots, b_{n-1}$ is P.

It follows that the probability of the correlation value R being $R = n - 2p$ is $nCp/2^n$.

In other words, if the correlation value R for a faultless circuit is $R = n - 2P$, while the number of output signal sequences that indicate a non-defect state is only one, the number of those whose correlation value R being $n - 2P$ is $nCp$, out of all the output signal sequences which might be $2^n$ in number.

Thus, out of the all output signal sequences excluding the one indicating a non-defect state, the number of output signal sequences whose respective correlation value R is $n - 2P$ must be $nCp - 1$.

This number is substantially the number of defects likely to be left undetected at all.

That is, for a circuit having defects to be otherwise detected, the probability of R being $n - 2p$, the value set forth for a faultless circuit, is as high as $nCp(nCp - 1)/\{2^n(2^n - 1)\}$.

The undetected error rate D0 for the sum of all the correlation values is $$\sum_{p=0}^{n} nCp \times (nCp - 1)/\{2^n(2^n - 1)\},$$

the value substantially equal to that obtainable with the conventional one's counting method.

2. Fault detection including a delay in the input test signal sequence

In this method, a cyclic code sequence (so-called M-sequence) may be employed as the test signal sequence input to circuits to be tested because it is easily generated by a shift register and yet it looks like a truly random sequence. It is to be noted that, in this fault detection structure, the correlation value for an input signal seqence with a delay is not independent from that for an input signal sequence without delay.

This will be seen clearly from the fact that, for a general input test signal sequence other than the M sequence, such as the sequence consisting of straight 0's or 1's, whether the sequence has a delay or no delay does not affect the correlation value.

Let the number of 0's or 1's in the input test sequence which transit from 0 to 1 or from 1 to 0 in one bit time interval be q.

Then the remaining $n - q$ 0's or 1's do not transmit in one bit time interval.

As was stated earlier the correlation value R can be calculated by counting the number of bi's in the input sequence which differ from ai's in the output sequence.

Therefore, if we take s bits out of the above stated q bits in the input sequence, which differ from the corresponding ai's in the output, in the case of no delay, the number of such cases is qCs.

Similarly, if we take t bits out of the above stated $n - q$ bits in the input sequence, which differ from the corresponding ai's in the output, in the case of no delay, the number of such cases is $n - qCt$.

From the above number of ai's equal to $t + s$, the correlation value R0 for the input sequence with no delay can be computed as $R0 = n - 2(t + s)$.

On the other hand, for the input sequence with one bit delay, the correlation value R1 is $n - 2(t + q - r)$. This is because that, while each of the above s ai's has the same value as their corresponding bi, the latter being transmitted, the remaining $(q - s)$ai's all take a different value from their corresponding bi's.

Also, from the above equations, it is seen that both $R_0$ and $R_1$ are unconditionally determined by s and t.

The probability of the correlation value for the input sequence having no delay is $n - 2(t + s)$ while that for the input sequence with a delay being $n-2(t+q-s)$ is obtained as $qCs\ n-qCt/2$, in a similar manner as in the previous section.

It follows, consequently, that the probability of a faulty circuit being estimated as having the same correlation value of the faultless circuit is $qCs\ n-qCt(qCs\ n-qCt-1)/\{2^n(2^n-1)\}$.

Since totaling the probabilities for all correlation values is substantially the same as summing with respect to the aforesaid numbers of ai's, t and s, the total undected error rate D, in case where we use both the correlation values R0 and R1, is $$D1 = \sum_{s=o}^{q} \sum_{t=o}^{v-q} qCs\ n - q\ (qCs\ n - qCt - 1)/\{2^n(2^n - 1)\}$$

3. Fault detection including double delays in the input test signal sequence.

Let us consider the q bits in the test signals that are changed from 0 to 1 or 1 or 1 to 0 within a one-bit time interval. If the number of those that change thereafter to 1 or 0 in a two-bit time interval is p, the number of bits that change thereafter to 0 or 1, is consequently $q-p$.

On the other hand, of the $(n-q)$ bits in the input signals that changed from 0 to 0 or 1 to 1 within a one-bit time interval, the number of those that change thereafter to 1 or 0 in a two-bit time interval is p.

Since the cyclic code sequence is employed in this embodiment, the total number of bits in the input test signals that change from 0 to 1 or 1 to 0 within the interval between the first and second delays is also q, so that the number of those which change from 0 to 0 then to 1 or 1 to 1 then to 0 is exactly equal to p, the value obtained by subtracting $q-p$ from q.

The number of bits in the input signals which transit from 0 to 0 then to 0 or from 1 to 1 then to 1 is $n-q-p$, the value obtained by subtracting from $n-q$ the above p, $q-p$, p.

If, for the input bits that change from 0 to 1 then to 1 or 1 to 0 then to 0 and from 0 to 0 then to 1 or 1 to 1 then to 0, the numbers of corresponding output bits ai's whose respective value differs from the paired input bit bi in the input sequence in case of no delay (where no transistion takes place), are respectively a and v, and the number of such cases are pCs and pCv, respectively.

Similarly, when, for the input bits that change from 0 to 1 then to 0 or 1 to 0 then to 1, the number of corresponding output bits ai's whose respective value differs from the paired input bit bi in the input sequence in case of no delay is t, the number of such cases is $q-pCt$.

Furthermore, if, for the input bits that transit from 0 to 0 then to 0 or 1 to 1 then to 1, the number of corresponding output bits ai's whose respective value differs from the paired input bit bi is u, then the number of such cases is computed as $n-p-qCu$.

Using the above assumed numbers s, t, and u, the correlation values for different states of delay are as follows:

$$R0 = n - 2(u+s+v+t) = n - 2(s+t+u+v)$$

for no delay in the input sequence.

$$R1 = n - 2(u+v+p-s+q-p-t) = n - 2(u-t+q+v-s)$$

for one bit delay in the input sequence.

$$R2 = n - 2(u+p-s+p-v+t) = n - 2(u+t-s-v+2p)$$

for two bits delay in the input sequence.

With respect to R0, the numbers of output bits ai's whose respective value differs from that of their corresponding bi in the aforesaid four modes of transition are s, t, v, and u, respectively.

R1 puts these numbers as $p-s$, $q-p-t$, v, and u, respectively where there is one bit delay in the input sequence.

R2 with two bits delay in the input sequence gives $p-s$, t, $p-v$, and u for the number of output bits ai's whose respective value differs from their corresponding bi in the four modes of transition.

Thus, for the above assumed numbers p and q of sequential input bits, the probability of the number of unpaired output bits being any of the particular values s, t, u, and v, is $pCs \bullet pCv \bullet q - pCt \bullet n - q - pCu/2^n$.

Of the output sequences excluding the one indicating a non-defect state, equal to $2-1$, the number of those in which the number of unpaired output signals is the same value as above s, t, u or v is estimated as $pCs \bullet pCv \bullet q - pCt \bullet n - q - pCp - 1$.

It follows that the probability for the number of unpaired output signals being any of the above particular values s, t, u, and v is $pCs \bullet pCv \bullet q - pCt \bullet n - q - pCux(pCs \bullet pCv \bullet q - pCt \bullet n - q - pCu - 1)/\{2^n(2^n - 1)\}$ It is important to note, however, that it can happen that R0, R1, R2 take identical values, respectively, even if the individual values for the set s, t, u and v are different.

For example, for an M sequence in which $n=7$, the values of R0, R1, and R2 are equally $-3$, 1, and 1, respectively, when s, t, u, and v are either 1, 2, 1, and 2 or 2, 1, 2, and 1, respectively.

Accordingly, in fault detection including up to double delays in the input test sequence, the rate of undetected errors is affected, not only by a formula summing the above probability with respect to s, t, u, and v, but by the fact that these R0, R1, and R2 can take an identical value for the different individual values of the set.

When we describe this effect by multiplying some constant K, the undetected error rate D2 for a fault detection system with double delays is $$D2 = k_2 \sum_{s=o}^{p} \sum_{v=o}^{p} \sum_{t=o}^{qp} \sum_{u=o}^{n-q-p} pCs \cdot pCv \cdot q - pCt \cdot n - q -$$

$$pCux(nCs\ pCv\ q - pCt\ n - q - pCu - 1)/\{2^n(2^n - 1)\}$$

It has been proved that K2 is approximately $\sqrt{\pi n}/4$.

The method of fault detection using a two-bits delay gives far more decreased undetected error rate compared with the previous fault detection method with one bit delay.

4. Fault detection including triple delays in the input test sequence.

The same principle as above is used to consider a fault detection system with triple delays in the input signal sequence.

The following equations may be used to give an approximate formula for each of the undetected error rates rates D0, D1, and D2 for no delay, one bit delay and double bit delays, respectively.

$\Sigma nCp = 2^n$ $\Sigma nCp = (2n)!/(n!)^n$ $n! = n^n e^n / \sqrt{2\pi n}$ (stirling's formula)

Figure 2:
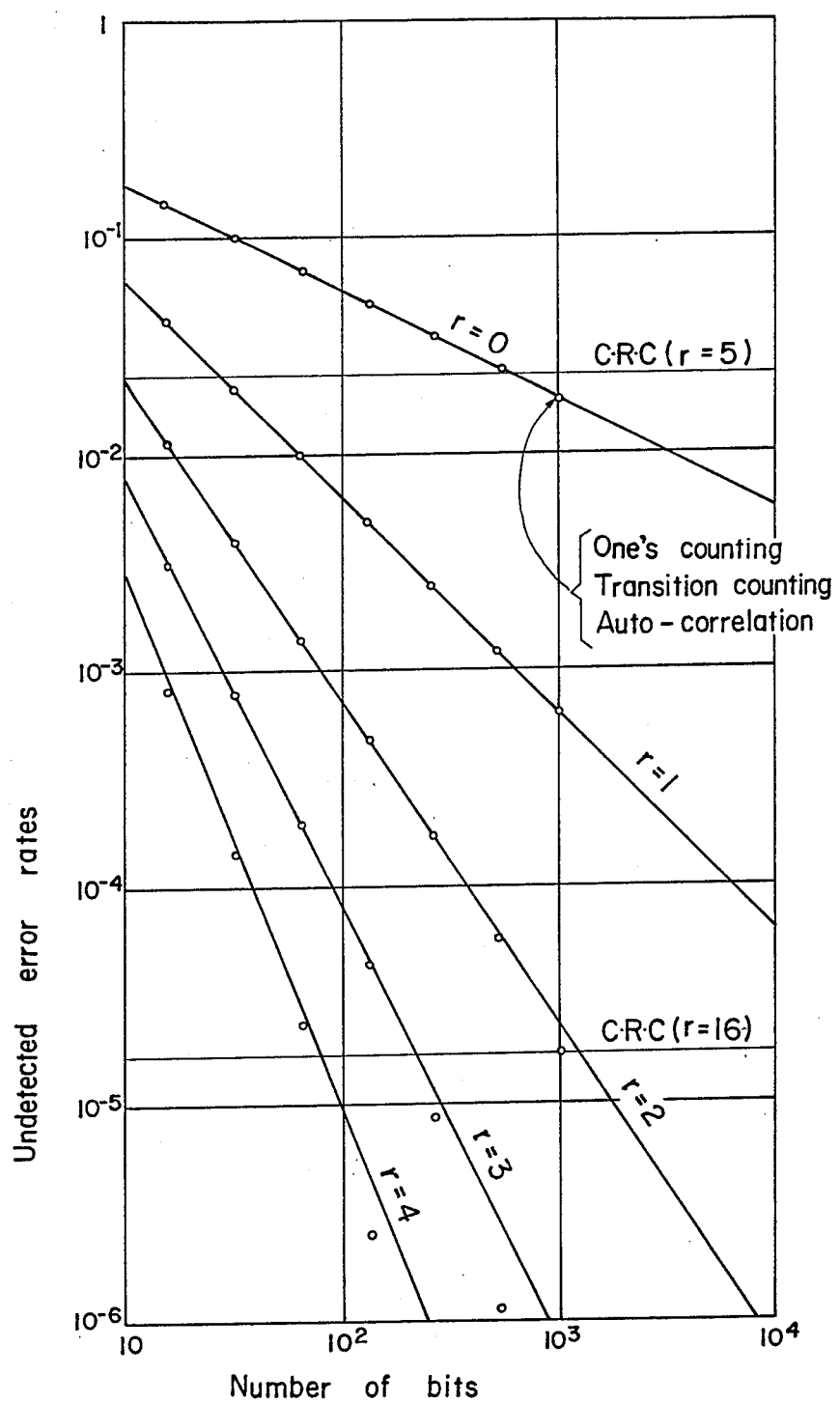

Since it is granted that D1 and D2 can be based on $q \approx n/2$ and $p \approx n/4$ in the case of an M sequence, $D0 = 1/\sqrt{\pi n}$ $D1 = 2/\pi n$ $D2 = 4/(\sqrt{\pi} n)^B$ $Dr = 2^r/(\sqrt{\pi} n)^{r+1}$ FIG. 2 shows curves plotted to show the undetected error rates for the five embodiments of this invention with no delay($r=0$), one bit delay($r=1$), double bit delay($r=2$), three bits delay($r=3$), and four bits delay($r=4$), and other conventional data compression method.

It will be clear from a study of FIG. 2 that the undetected error rate can be reduced in steps, and more so if the output signal sequence is increased in length according to this invention.

Figure 3A:
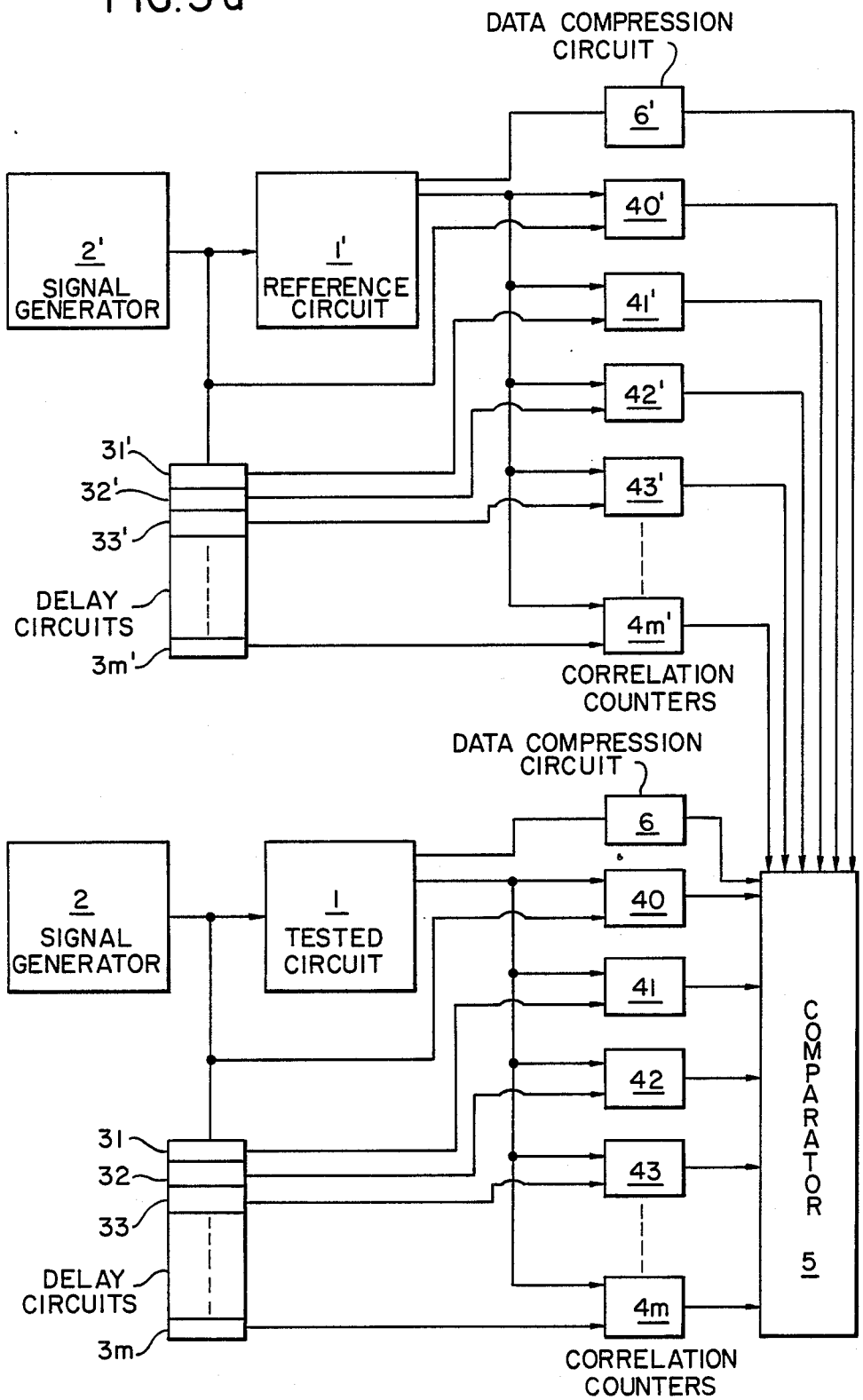
Figure 3B:
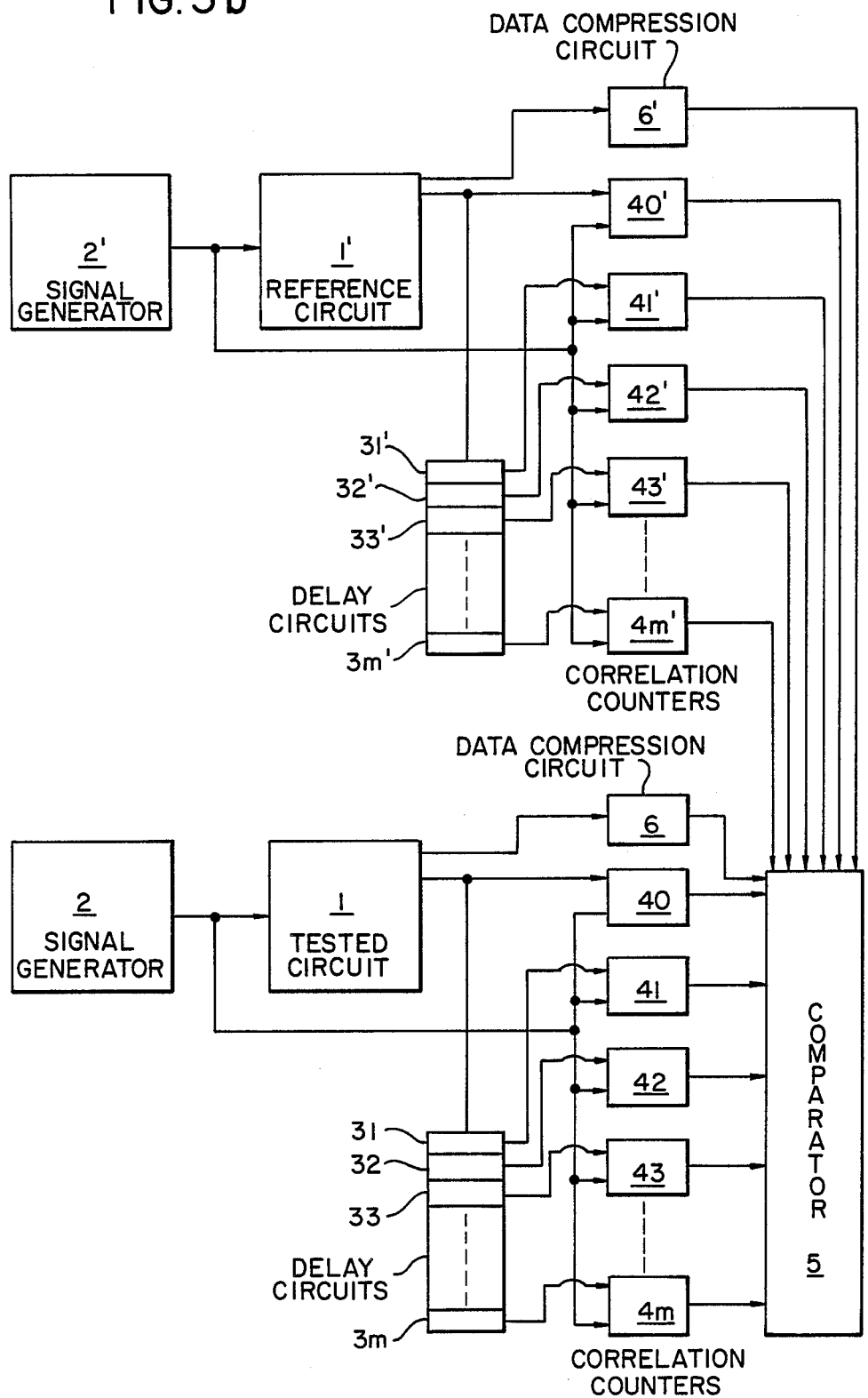

FIGS. 3(a) and 3(b) are third and fourth embodiments of this invention in which the first and second embodiments of FIGS. 1(a) and (b) are combined with a data compression circuit 6 according to a conventional method such as one's counting, transition counting, auto-correlation, and C. R. C. methods.

Figure 1B:
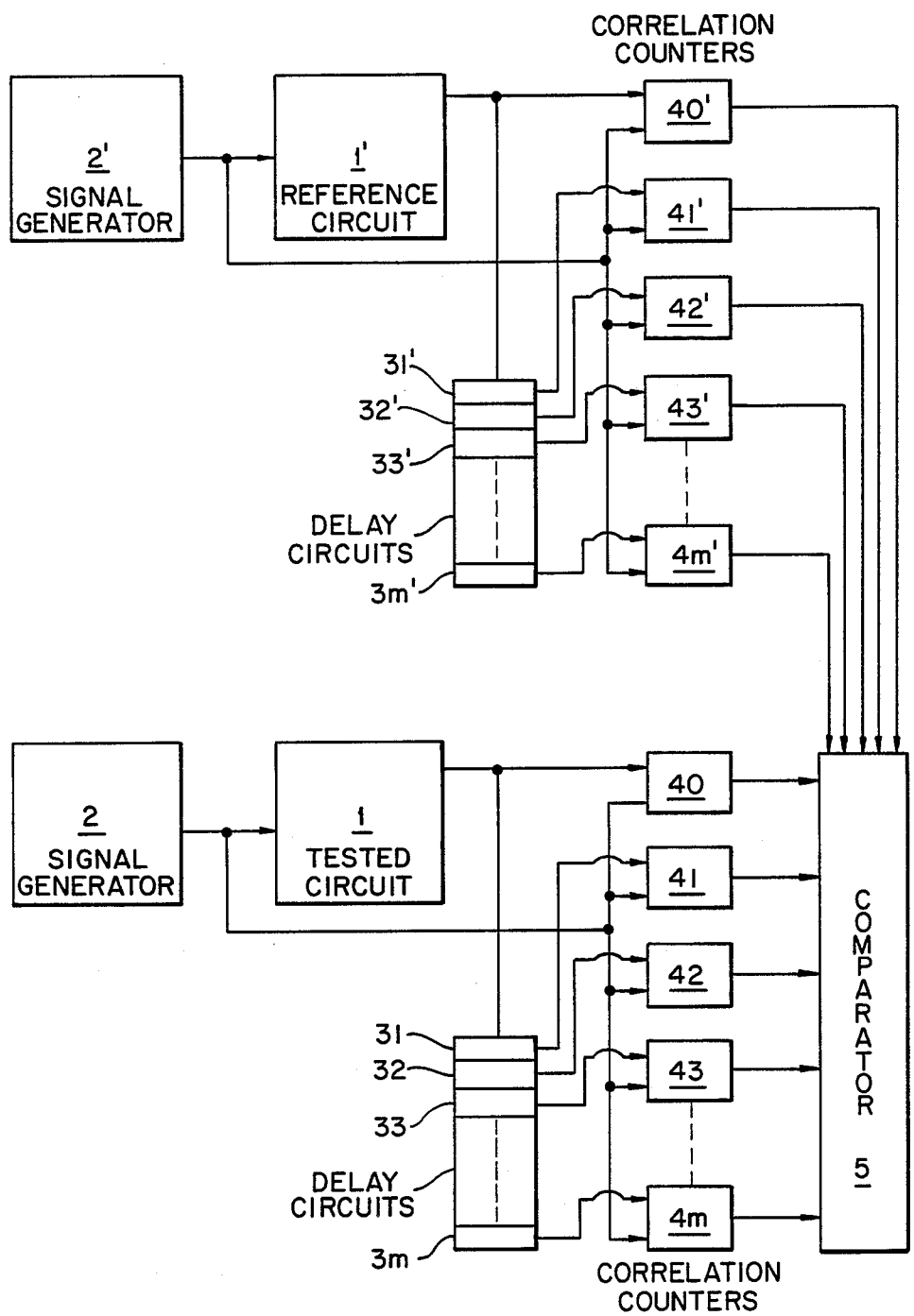

In these embodiments, both outputs from the circuit to be detected and the faultless circuit are connected to the input of a conventional data compression circuit 6. Also, a compararor 5 is provided not only to make the same comparison of data described in association with FIGS. 1(a) and 1(b) but also to perform data comparison according to a conventional method. In other words, since the data are compressed in two different manners, defects that might be overlooked by one detection system can be spotted by the other, reducing the undetected error rate of the overall system.

What is claimed is:

1. An apparatus for fault detection in electronic circuits employing a correlation method, comprising:
   first test circuitry including
      a signal generator for supplying a circuit to be tested with a sequence of test signals,
      at least one delay circuit connected to the output of said generator,
      a plurality of correlation counters connected to the output of said generator, the output of said delay circuit and the output of said test circuit for counting correlation values between signals input to and output from said tested circuit,
   a reference circuitry including
      a second signal generator for supplying a reference faultless circuit with a sequence of test signals, the same number of delay circuits as in said test circuitry connected to the output of said second signal generator, the same number of correlation counters as in said test circuitry connected to the output of said second signal generator and each of the outputs of said delay circuits, and an output of said reference circuit for counting correlation values between the signals input to and output from said reference circuitry, and
   a comparator connected to outputs of said counters of both said test and reference circuitries for comparing the correlation values output therefrom.

2. An apparatus for fault detection in electronic circuits employing a correlation method, comprising:
   a first test circuitry including
      a signal generator for supplying a circuit to be tested with a sequence of test signals,
      at least one delay circuit connected to the output of said test circuit, a plurality of correlation counters connected to the output of said generator, the output of said delay circuit, and the output of said test circuit for counting the correlation values between the signals input to and output from said test circuit,
   a reference circuitry including
      a second signal generator for supplying a reference faultless circuit with a sequence of test signals, the same number of delay circuits as in said test circuitry connected to the output of said reference circuitry,
      the same number of correlation counters as in said test circuitry connected to the output of said reference circuit and each of the outputs of said delay circuits, and the output of said second signal generator counts correlation values between the signals input to and output from said reference circuitry, and
   a comparator connected to outputs of said counters of both said test and reference circuitries for comparing the correlation values output therefrom.

3. The apparatus set forth in claim 1 or 2, wherein each of said test and reference circuitries each has a data compression circuit according to at least one data compression methods selected from the group of one's counting, transition counting, auto-correlation, and C. R. C. methods and connected to the outputs of said tested and reference circuits, respectively.

4. A fault detection method using correlation for electronic circuits, comprising the steps of:
   inputting a test signal sequence to a circuit to be tested;
   producing a first output signal sequence from said circuit to be tested.
   delaying one of said test signal sequence and said first output sequence to produce a delayed sequence;
   counting first correlation values between the other of said test signal sequence and said first output signal sequence, and said first delayed sequence;
   inputting said test signal sequence to a reference faultless circuit;
   producing a second output signal sequence from said reference faultless circuit in response to said test signal sequence;
   delaying one of said test signal sequence and said second output signal sequence to produce a second delayed sequence;
   counting correlation values between the other of said test signal sequence and said second output signal sequence, and said second delayed sequence; and
   comparing said first and second correlation values.

5. The fault detection method set forth in claim 4, wherein additional comparison is made between the output signals from both said tested and reference circuits by data compression using at least one data compression method selected from the group of one's counting, transition counting, auto-correlation, and C. R. C. methods.